(12) United States Patent
Loy et al.

(10) Patent No.: US 10,847,720 B1
(45) Date of Patent: Nov. 24, 2020

(54) NON-VOLATILE MEMORY ELEMENTS WITH FILAMENT CONFINEMENT

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Bin Liu, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/447,460

(22) Filed: Jun. 20, 2019

(51) Int. Cl.
*H01L 47/00* (2006.01)
*H01L 45/00* (2006.01)
*H01L 27/24* (2006.01)

(52) U.S. Cl.
CPC ...... *H01L 45/1253* (2013.01); *H01L 27/2436* (2013.01); *H01L 45/1233* (2013.01); *H01L 45/16* (2013.01)

(58) Field of Classification Search
CPC . H01L 45/1253; H01L 45/1233; H01L 45/16; H01L 27/2436; H01L 27/249; H01L 45/146; H01L 27/2454; H01L 45/1675; H01L 27/11582; H01L 45/06; H01L 27/2481; H01L 45/08; H01L 45/1226; H01L 23/528; H01L 27/2463; H01L 45/04; G11C 13/0004; G11C 13/0007; G11C 2213/71; G11C 11/405; G11C 13/0002; G11C 13/003; G11C 13/0069; G11C 11/1659; G11C 11/54; G11C 13/0023; G11C 13/004; G11C 17/165; G11C 2213/52; G11C 2213/79; G11C 5/025; G11C 7/1006; G11C 11/16; G11C 11/161; G11C 11/223; G11C 11/401; G11C 11/4076; G11C 11/4096; G11C 11/419; G11C 13/0011; G11C 13/0026; G11C 13/0028; G11C 16/08; G11C 16/10; G11C 16/26; G11C 2207/229; G11C 2213/15;
(Continued)

(56) References Cited

U.S. PATENT DOCUMENTS 8,853,713 B2   10/2014  Marsh et al.
2005/0285204 A1*  12/2005  Kim ........................ H01L 21/84
                                                                257/368
(Continued)

OTHER PUBLICATIONS

Huang et al., "Low-power resistive random access memory by confining the formation of conducting filaments" AIP ADVANCES 6, 065022 (2016).

(Continued)

*Primary Examiner* — Robert G Bachner
(74) *Attorney, Agent, or Firm* — Thompson Hine LLP

(57) ABSTRACT

Structures for a non-volatile memory and methods of forming and using such structures. A resistive memory element includes a first electrode, a second electrode, and a switching layer arranged between the first electrode and the second electrode. A transistor includes a drain coupled with the second electrode. The switching layer has a top surface, and the first electrode is arranged on a first portion of the top surface of the switching layer. A hardmask, which is composed of a dielectric material, is arranged on a second portion of the top surface of the switching layer.

19 Claims, 6 Drawing Sheets

(58) Field of Classification Search
CPC .......... G11C 2213/31; G11C 2213/32; G11C 2213/72; G11C 2213/76; G11C 2213/77; G11C 8/10; G11C 11/1653; G11C 11/1655; G11C 11/1657; G11C 11/1675; G11C 11/2259; G11C 11/403; G11C 11/409; G11C 11/4091; G11C 11/4094; G11C 11/5614; G11C 11/5628; G11C 11/5635; G11C 11/5642; G11C 11/5657; G11C 11/5671; G11C 13/0009; G11C 13/0038; G11C 14/0072; G11C 14/009; G11C 15/046; G11C 16/0408; G11C 16/0416; G11C 16/0441; G11C 16/0466; G11C 16/0483; G11C 16/14; G11C 16/16; G11C 16/3418; G11C 2013/0054; G11C 2029/0403; G11C 2029/5002; G11C 2213/51; G11C 2213/53; G11C 2213/56; G11C 2213/78; G11C 2213/80; G11C 2213/81; G11C 2213/82; G11C 29/4401; G11C 5/02; G11C 5/06; G11C 5/14; G11C 7/06; G11C 7/12; G11C 7/18; G11C 8/08; G11C 8/14
See application file for complete search history.

(56) References Cited

U.S. PATENT DOCUMENTS

| | | | | |
|---|---|---|---|---|
| 2006/0054950 | A1* | 3/2006 | Baek | H01L 45/146 257/295 |
| 2008/0247214 | A1* | 10/2008 | Ufert | H01L 45/142 365/148 |
| 2008/0261362 | A1* | 10/2008 | Zhang | H01L 29/66636 438/230 |
| 2010/0013047 | A1* | 1/2010 | Thies | H01L 29/66181 257/532 |
| 2016/0111638 | A1* | 4/2016 | Banno | H01L 45/146 257/4 |

OTHER PUBLICATIONS

Bai et al., "Study of Multi-level Characteristics for 3D Vertical Resistive Switching Memory", Scientific Reports vol. 4, Article No. 5780 (2014).

Feng et al., "Investigation of switching mechanism in HfOx-ReRAM under low power and conventional operation modes" Scientific Reports vol. 6, Article No. 39510 (2016).

Niu et al, Geometric conductive filament confinement by nanotips for resistive switching of HfO2-RRAM devices with high performance, Scientific Reports vol. 6, Article No. 25757 (2016).

Mehr et al., "Ultra sharp crystalline silicon tip array used as field emitter", Microelectronic Engineering vol. 30, Issues 1-4, Jan. 1996, pp. 395-398.

Loy et al., "Conduction Mechanisms on High Retention Annealed MgO-based Resistive Switching Memory Devices", Scientific Reportsvolume 8, Article No. 14774 (2018).

* cited by examiner

US 10,847,720 B1

NON-VOLATILE MEMORY ELEMENTS WITH FILAMENT CONFINEMENT

BACKGROUND

The present invention relates to integrated circuits and semiconductor device fabrication and, more specifically, to structures for a non-volatile memory and methods of forming and using such structures.

A resistive random access memory (ReRAM) device provides one type of embedded non-volatile memory technology. Because the memory elements are non-volatile, the stored bits of data are retained by the ReRAM device when the memory elements are not powered. The non-volatility of a ReRAM device contrasts with volatile memory technologies, such as a static random access memory (SRAM) device in which the stored content is eventually lost when unpowered and a dynamic random access memory (DRAM) device in which the stored content is lost if not periodically refreshed.

Data is stored in a ReRAM element by changing the resistance across a dielectric layer to provide different information-storage states—a high-resistance state and a low-resistance state—representing the stored bits of data. The dielectric material, which is normally insulating, can be modified to conduct through one or more filaments or conductive paths that are generated by applying a sufficiently high voltage across the dielectric material. The filaments of the ReRAM element are created or destroyed in order to respectively write the low-resistance state or the high-resistance state.

The resistance in the high-resistance state may vary significantly among different ReRAM elements due to variations in filament destruction, which is a stochastic process. Switching voltages intended to change the information-storage states may also exhibit a high level of variability due at least in part to the resistance variations in the high-resistance state.

Improved structures for a non-volatile memory and methods of forming and using such structures are needed.

SUMMARY

According to an embodiment of the invention, a structure includes a resistive memory element having a first electrode, a second electrode, and a switching layer arranged between the first electrode and the second electrode. A transistor includes a drain coupled with the second electrode. The switching layer has a top surface, and the first electrode is arranged on a first portion of the top surface of the switching layer. The structure further includes a hardmask composed of a dielectric material and arranged on a second portion of the top surface of the switching layer.

According to another embodiment of the invention, a method includes depositing a layer stack including a conductor layer and a dielectric layer on the conductor layer, forming a hardmask covering a first portion of a top surface of the dielectric layer, and forming a first electrode on a second portion of the top surface of the dielectric layer at an outer side surface of the hardmask. After forming the first electrode, the first conductor layer and the dielectric layer are patterned to form a second electrode and a switching layer that is arranged between the first electrode and the second electrode. The first electrode, the second electrode, and the switching layer collectively provide a resistive memory element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 5A is a top view in which FIG. 5 is taken generally along line 5-5.

FIG. 7A is a simplified top view in which FIG. 7 is taken generally along line 7-7 and in which overlying portions of the interconnect structure are omitted for clarity of illustration.

DETAILED DESCRIPTION

Figure 1:
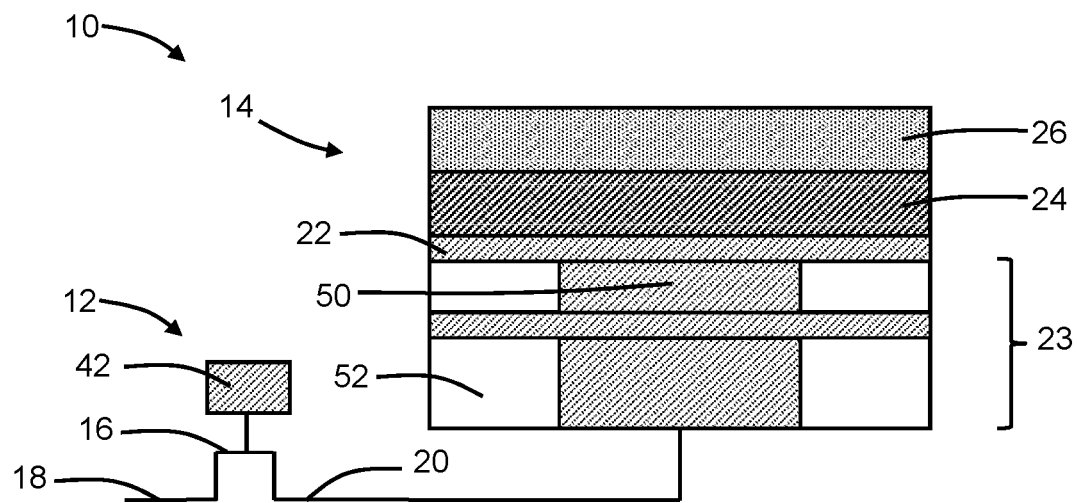
FIGS. 1-6 are diagrammatic cross-sectional views of a resistive random access memory bitcell at successive fabrication stages of a processing method in accordance with embodiments of the invention.

With reference to FIG. 1 and in accordance with embodiments of the invention, a bitcell 10 for a resistive random access memory (ReRAM) device includes a transistor 12 and a resistive memory element 14. The transistor 12 may include a gate electrode 16, a source 18, and a drain 20, and may be formed by front-end-of-line processing of a substrate, such as a device layer of a silicon-on-insulator wafer or a bulk substrate. The gate electrode 16 may be composed of a conductor, such as doped polycrystalline silicon (i.e., polysilicon) or one or more metals, that is separated from an active region of the substrate by a gate dielectric. The gate dielectric may be composed of an electrical insulator, such as silicon dioxide ($SiO_2$) or a high-k dielectric material. The source 18 and drain 20 may be composed of a doped semiconductor material, such as doped silicon or doped silicon-germanium. The transistor 12 may be, for example, an n-type planar field-effect transistor, an n-type fin-type field-effect transistor, or an n-type gate-all-around field-effect transistor.

The resistive memory element 14 may be disposed in a metallization level of an interconnect structure fabricated by middle-of-line and back-end-of-line processing over the transistor 12. The resistive memory element 14 is positioned over a metal feature 22 in one of the metallization levels, such as the M2 metallization level, of the interconnect structure. The interconnect structure includes one or more interlayer dielectric layers 52 and an interconnection 50 having one or more metal islands, vias, and/or contacts arranged in the one or more interlayer dielectric layers 52. The one or more interlayer dielectric layers 52 may be composed of a dielectric material, such as carbon-doped silicon dioxide, and the interconnection 50 may be composed of one or more metals, such as copper, cobalt, tungsten, and/or a metal silicide.

The resistive memory element 14 includes a bottom electrode 24 arranged over the metal feature 22 and a switching layer 26 arranged over the bottom electrode 24. The bottom electrode 24 may be composed of a metal, such as ruthenium, platinum, titanium nitride, or tantalum nitride, that may be selected based on factors such as oxidation resistance and work function difference relative to a subsequently-formed top electrode. The switching layer 26 may be composed of a transition metal oxide, such as such as magnesium oxide, tantalum oxide, hafnium oxide, titanium oxide, aluminum oxide, or silicon dioxide, or a transition metal nitride. The bottom electrode 24 is coupled by the metal feature 22 and interconnection 50 with the drain 20 of the transistor 12.

Figure 2:
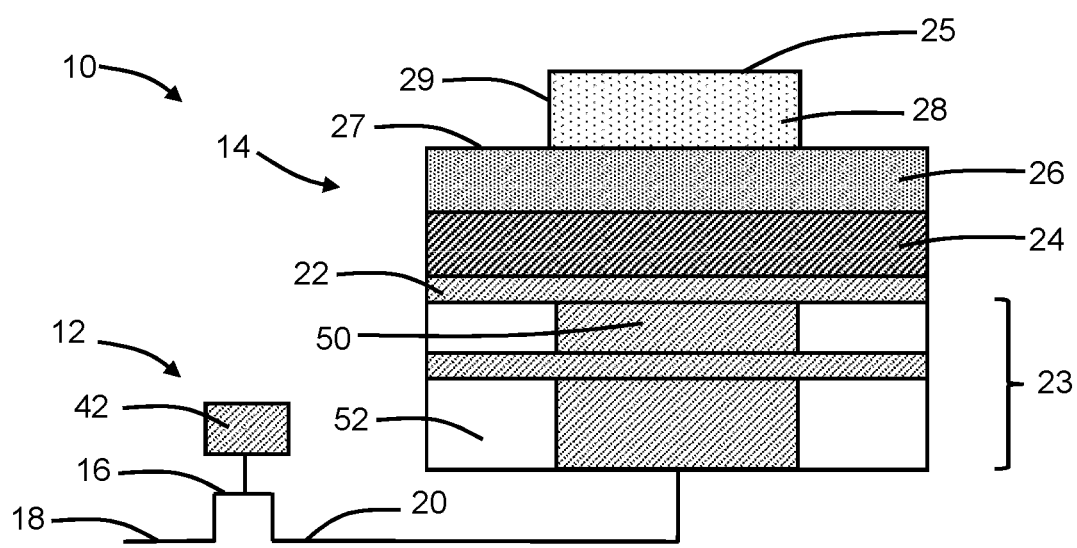

With reference to FIG. 2 in which like reference numerals refer to like features in FIG. 1 and at a subsequent fabrication stage of the processing method, a hardmask 28 is deposited over the switching layer 26 and patterned to define a portion that covers an area of given dimensions on a top surface 27 of the switching layer 26. The hardmask 28 may be composed of a dielectric material, such as silicon dioxide or silicon nitride, and may be patterned by lithography and etching processes. The patterned hardmask 28 has a closed shape, such as a rectangular shape, and includes an outer sidewall or side surface 29 that extends about the outer edge providing the perimeter of the closed shape and a top surface 25. In an embodiment, the portion of the hardmask 28 may be centered on the top surface 27 of the switching layer 26.

Figure 3:
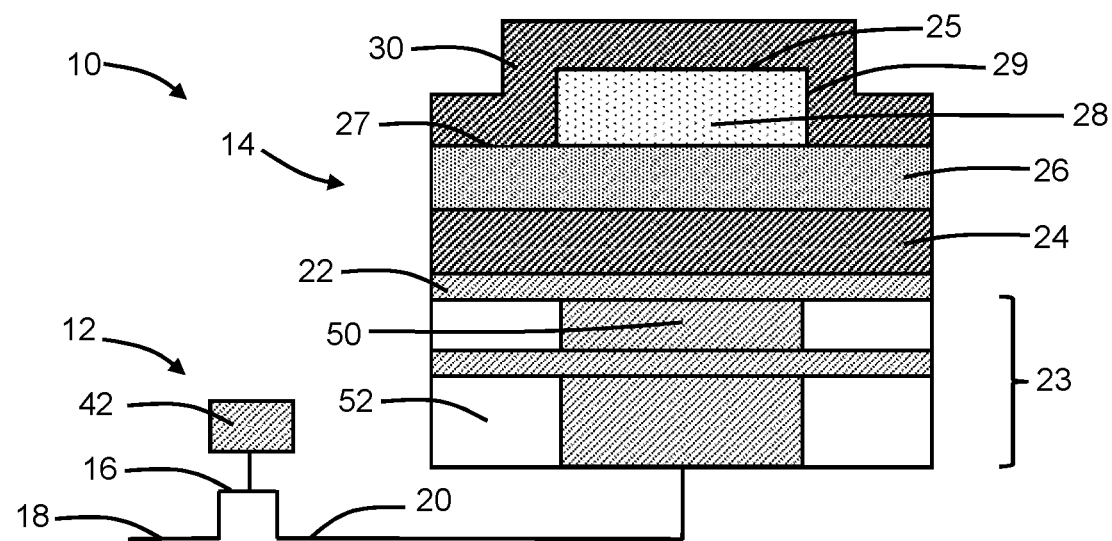

With reference to FIG. 3 in which like reference numerals refer to like features in FIG. 2 and at a subsequent fabrication stage of the processing method, an electrode layer 30 is deposited over the top surface 27 of the switching layer 26 and on the top surface 25 and side surface 29 of the portion of the hardmask 28. The electrode layer 30 may be composed of a metal, such as tantalum, hafnium, titanium, copper, silver, cobalt, or tungsten, deposited by, for example, physical vapor deposition.

Figure 4:
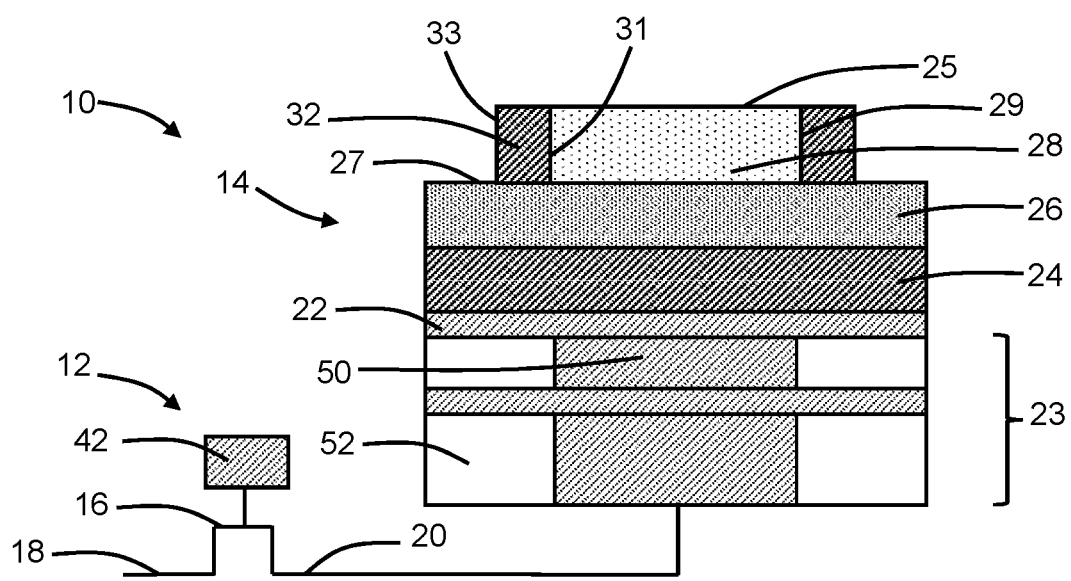

With reference to FIG. 4 in which like reference numerals refer to like features in FIG. 3 and at a subsequent fabrication stage of the processing method, a top electrode 32 is formed by etching the electrode layer 30 with an etching process that shapes the electrode layer 30 into a sidewall spacer that surrounds the portion of the hardmask 28 and, in particular, surrounds the side surface 29 of the portion of the hardmask 28. The etching process may be an anisotropic etching process, such as reactive ion etching, that removes the material of the electrode layer 30 selective to the materials of the hardmask 28 and switching layer 26. As used herein, the terms "selective" in reference to a material removal process (e.g., etching) denotes that the material removal rate (i.e., etch rate) for the targeted material is higher than the material removal rate (i.e., etch rate) for at least another material exposed to the material removal process. The electrode layer 30 is fully removed from the top surface 25 of the portion of the hardmask 28 and from the top surface 27 of the switching layer 26 adjacent to the top electrode 32.

The top electrode 32 is arranged adjacent to the side surface 29 of the portion of the hardmask 28. The top electrode 32 covers an area on the top surface 27 of the switching layer 26. The portion of the hardmask 28, which is surrounded by the top electrode 32, fills the space inside an inner sidewall or side surface 31 of the top electrode 32. The top electrode 32 also has an outer sidewall or side surface 33 that is, similar to the inner side surface 31, arranged over the top surface 27 of the switching layer 26. The top electrode 32 may have a closed geometrical shape that is arranged between the inner side surface 31 and the outer side surface 33. In an embodiment, the top electrode 32 may have the shape of a rectangular annulus representing a region between parallel rectangles of different size such that the smaller inner rectangular boundary defined by the inner side surface 31 is fully arranged inside the larger outer rectangle defined by the outer side surface 33. The top electrode 32 covers a fraction of the total area of the top surface 27 of the switching layer 26, and the portion of the hardmask 28 also covers a fraction of the total area on the top surface 27 of the switching layer 26 with the individual area fractions summing to a summed area that is less than the total area of the top surface 27. In the representative embodiment, the outer side surface 29 of the hardmask 28 and the inner side surface 31 of the top electrode 32 are coextensive and converge along an interface.

Figure 5:
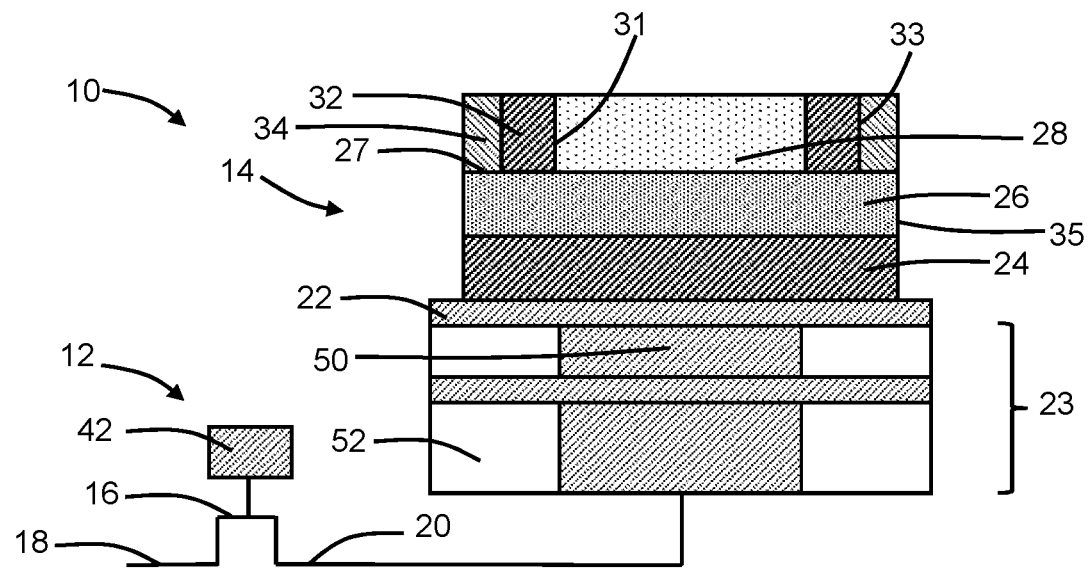
Figure 5A:
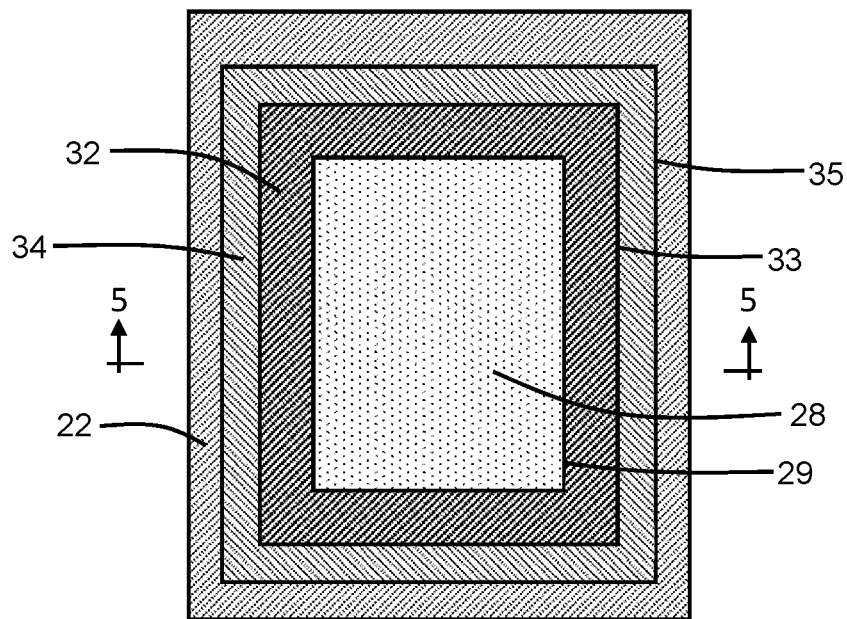

With reference to FIGS. 5 and 5A in which like reference numerals refer to like features in FIG. 4 and at a subsequent fabrication stage of the processing method, a sidewall spacer 34 is formed on the top surface 27 of the switching layer 26 and surrounds the top electrode 32. The sidewall spacer 34 is arranged outside of the outer side surface 33 of the top electrode 32, and has a given thickness such that a portion of the top surface 27 of the switching layer 26 is covered. The sidewall spacer 34 may cover the fraction of the total area of the top surface 27 of the switching layer 26 that is not covered by the top electrode 32 and the portion of the hardmask 28 such that the sum of the individual covered areas is substantially equal to the area of the top surface 27 of the switching layer 26, which results in full coverage of the top surface 27 of the switching layer 26.

The sidewall spacer 34 may be composed of a dielectric material that is deposited by a conformal deposition process, such as silicon dioxide or silicon nitride deposited by atomic layer deposition, and then etched with an anisotropic etching process, such as reactive ion etching. In an embodiment, the dielectric materials of the sidewall spacer 34 and the hardmask 28 may be different. In an embodiment, the anisotropic etching process may remove the dielectric material constituting the sidewall spacer 34 selective to the materials of the top electrode 32, hardmask 28, and switching layer 26. In an alternative embodiment, the dielectric materials of the sidewall spacer 34 and the hardmask 28 may be the same.

Following the formation of the sidewall spacer 34, the layer stack including the switching layer 26 and bottom electrode 24 is etched with an etching process, which may be self-aligned by the sidewall spacer 34. The etching process may be an anisotropic etching process, such as reactive ion etching (RIE), that removes the materials of the switching layer 26 and bottom electrode 24 selective to the materials of the top electrode 32, hardmask 28, and sidewall spacer 34. The sidewall spacer 34 may function to reduce sputtering of the top electrode 32 during the etching of the layer stack and may also function to prevent electrode shorting during device operation.

The outer side surface 33 of the top electrode 32 is inset inside an outer sidewall or side surface 35 of the patterned switching layer 26 and bottom electrode 24. Specifically, the sidewall spacer 34 covers a portion of the top surface 27 of the switching layer 26 that is arranged between the respective side surfaces 33, 35. The inner side surface 31 of the top electrode 32 is inset by a greater distance inside the outer side surface 35 of the patterned switching layer 26 and bottom electrode 24 than the outer side surface 33 of the top electrode 32. The lateral dimensions of the top electrode 32 are established before the layer stack including the switching layer 26 and bottom electrode 24 is patterned and are established independent of the patterning of the layer stack.

Figure 6:
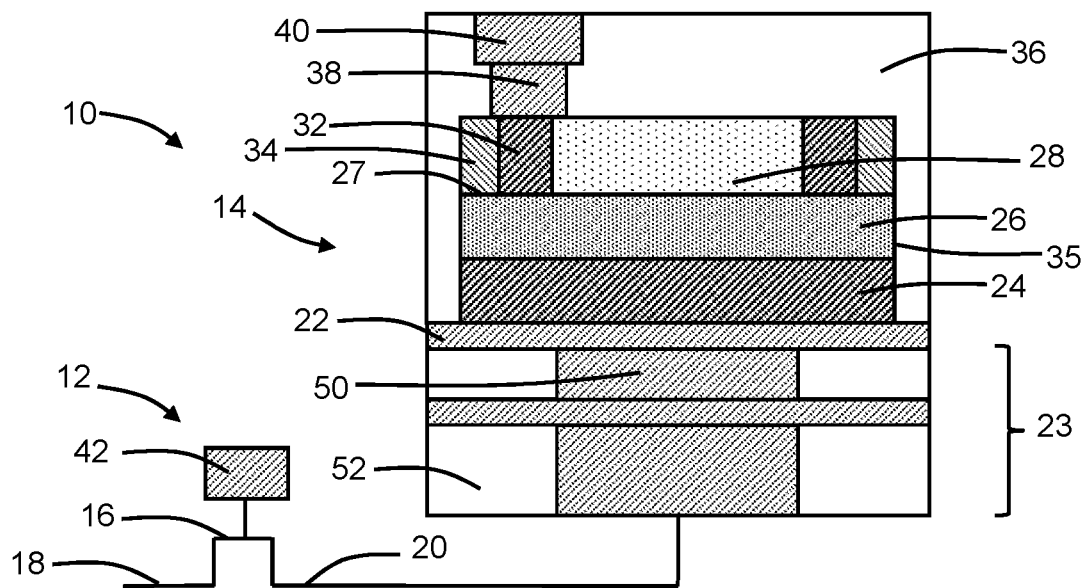

With reference to FIG. 6 in which like reference numerals refer to like features in FIG. 5 and at a subsequent fabrication stage of the processing method, a bit line 40 and a via 38 connecting the bit line 40 with the top electrode 32 are formed in an interlayer dielectric layer 36 of one or more overlying metallization levels of the interconnect structure.

A word line 42, which may also be formed in the one or more overlying metallization levels of the interconnect structure, is coupled with the gate of the transistor 12. The interlayer dielectric layer 36 may be composed of a dielectric material, such as carbon-doped silicon dioxide, that is deposited by chemical vapor deposition and then planarized with chemical-mechanical polishing.

In use, the resistive memory element 14 may be programmed using the transistor 12 to provide the low-resistance information storage state by directing one or more pulses of electrical current with a given set of parameters between the bottom electrode 24 and the top electrode 32. The one or more pulses are effective to decrease an electrical resistance of the switching layer 26 by forming filaments that extend through the switching layer 26 between the bottom electrode 24 and the top electrode 32. The parameters may include, but are not limited to pulse width or duty cycle, and pulse height or voltage. The resistive memory element 14 may also be programmed using the transistor 12 to provide the high-resistance information storage state by directing one or more pulses of electrical current with a given set of parameters between the bottom electrode 24 and the top electrode 32. The one or more pulses are effective to increase the electrical resistance of the switching layer 26 by breaking or interrupting one or more, or all, of the filaments to no longer bridge through the thickness of the switching layer 26.

The representative embodiment of the bitcell 10 has a one transistor-one resistor (1T-1R) arrangement that includes the transistor 12 and a resistor defined by the memory element 14. The reduced dimensions and positioning of the top electrode 32 relative to the switching layer 26, in comparison with a planar-slab top electrode commensurate in size with the switching layer 26, may function to laterally confine the filaments within the switching layer 26 and between the electrodes 24, 32. The improvement in filament confinement may reduce the resistance variability in the high-resistance state among different bitcells 10 that are in the same ReRAM device. The dimensions of the top electrode 32 are not limited by lithography, and the formation of the resistive memory element 14 is compatible with complementary-metal-oxide-semiconductor processes.

Figure 7:
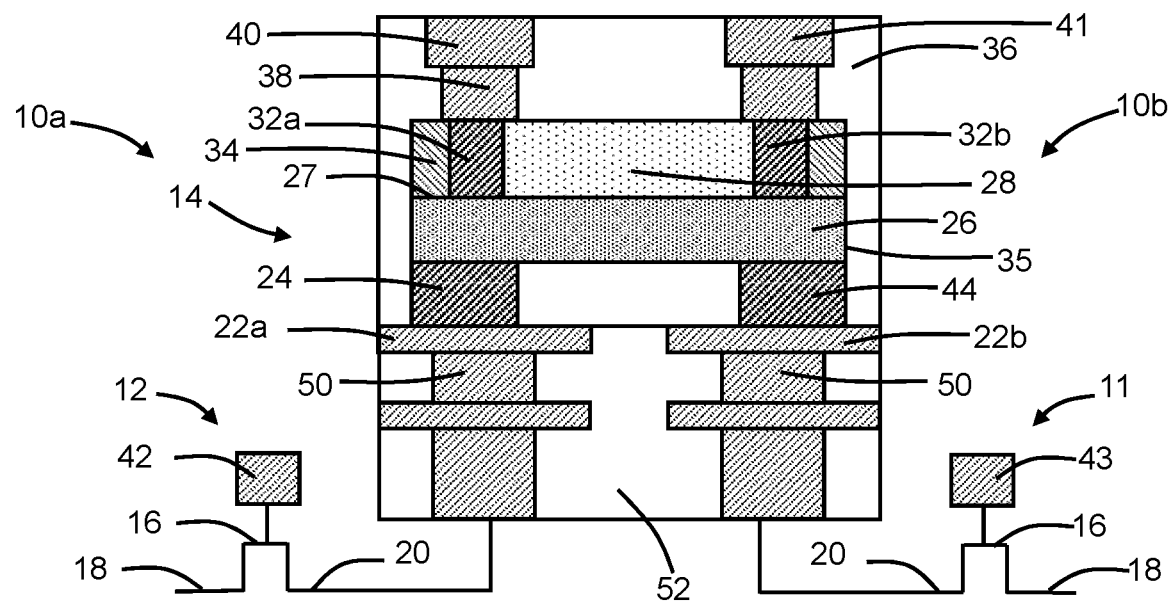
FIGS. 7-10 are diagrammatic cross-sectional views of resistive random access memory bitcells in accordance with alternative embodiments of the invention.
Figure 7A:
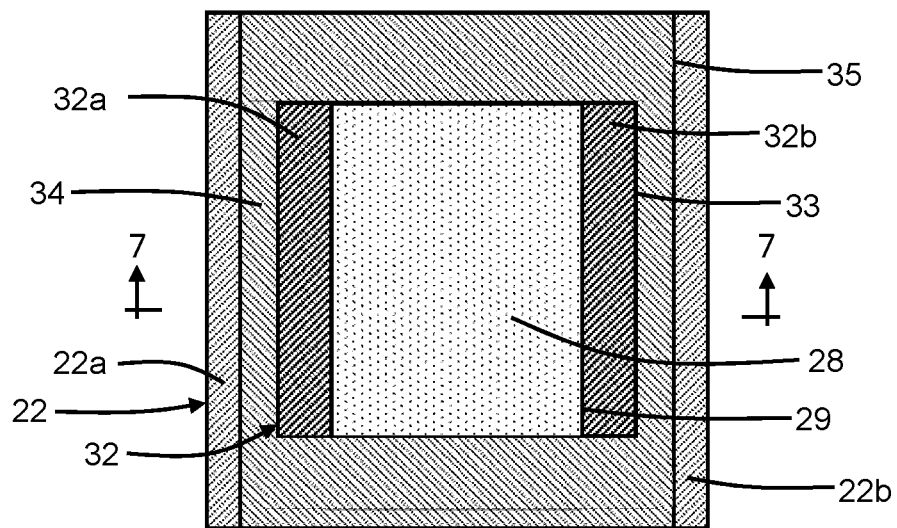

With reference to FIGS. 7, 7A in which like reference numerals refer to like features in FIG. 6 and in accordance with alternative embodiments, the bitcell 10 may be split into two different bitcells 10a, 10b each having its own transistor and a 1T-1R architecture that shares the portion of the hardmask 28. The bitcell 10b includes another transistor 11 that is similar or identical to the transistor 12, and the transistor 12 is associated only with the bitcell 10a. The gate of the transistor 11 is connected to a word line 43, and the drain of the transistor 11 is connected through another interconnection 50 with a bottom electrode 44 similar or identical to the bottom electrode 24. The metal feature 22 is divided into two sections 22a, 22b to provide the independent connections between the different interconnections 50 and the respective bottom electrodes 24, 44. The bottom electrodes 24, 44 are electrically isolated from each other by the dielectric material of the one or more interlayer dielectric layers 52. However, both of the bottom electrodes 24, 44 are coupled with the same switching layer 26.

The top electrode 32 is patterned with lithography and etching processes involving a cut mask to form a section 32a and a section 32b that are separated from each other and that lack electrical continuity. The section 32a is associated with the bitcell 10a, and the section 32b is associated with the bitcell 10b to provide respective 1T1R arrangements. The top electrode 32 may be patterned before forming the sidewall spacer 34. The sections 32a, 32b of the top electrode 32 may be separated from each other by dielectric material, such as the dielectric material of the sidewall spacer 34. One of the sections 32a of the top electrode 32 is coupled with the bit line 40, and the other of the sections 32b of the top electrode 32 is coupled with a different bit line 41. The dimensions of the bitcells 10a, 10b are determined in part by the dimensions of the portion of the hardmask 28 between the sections 32a, 32b of the top electrode 32, which may remove the resistive memory element 14 as a limiting factor on bitcell size and shift any size limitations to the transistors 11, 12. The reduced dimensions of the sections 32a, 32b of the top electrode 32 may improve the resistance variability in the high-resistance state.

Figure 8:
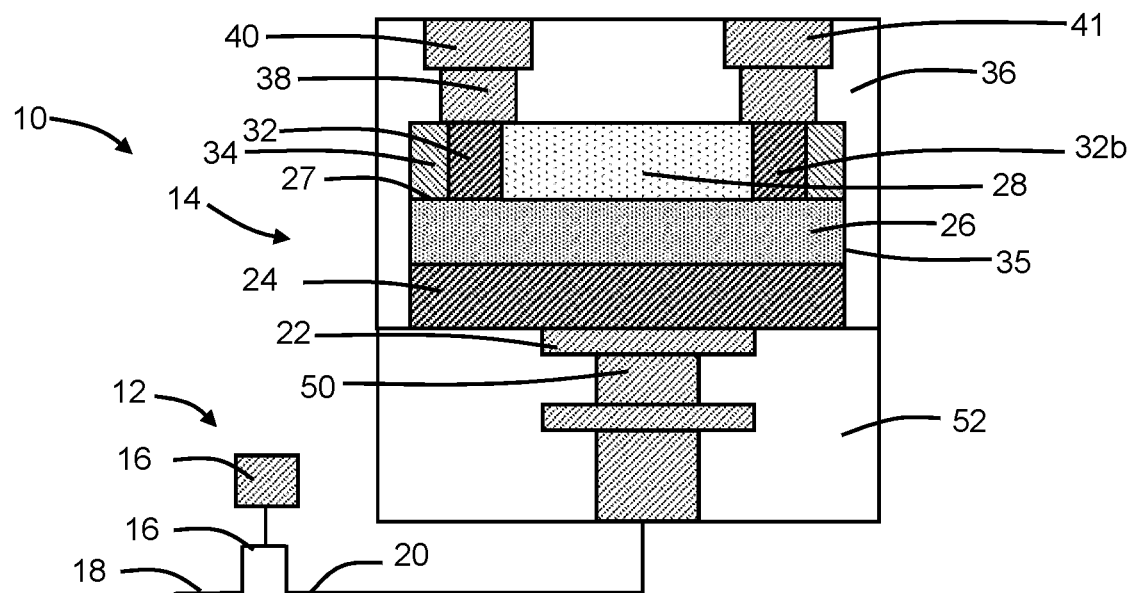

With reference to FIG. 8 in which like reference numerals refer to like features in FIG. 6 and in accordance with alternative embodiments, the bitcell 10 may be modified to include only the bottom electrode 24 and the transistor 12 in combination with the multiple sections 32a, 32b of the top electrode 32. This architecture provides the bitcell 10 with a one transistor-two resistor (1T-2R) architecture that includes the transistor 12 and respective resistors defined by different portions of the switching layer 26. Two bits can be stored in the bitcell 10 by switching between the low-resistance and high-resistance states. The reduced dimensions of the top electrode may improve the resistance variability exhibited in the high-resistance state among different bitcells 10.

Figure 9:
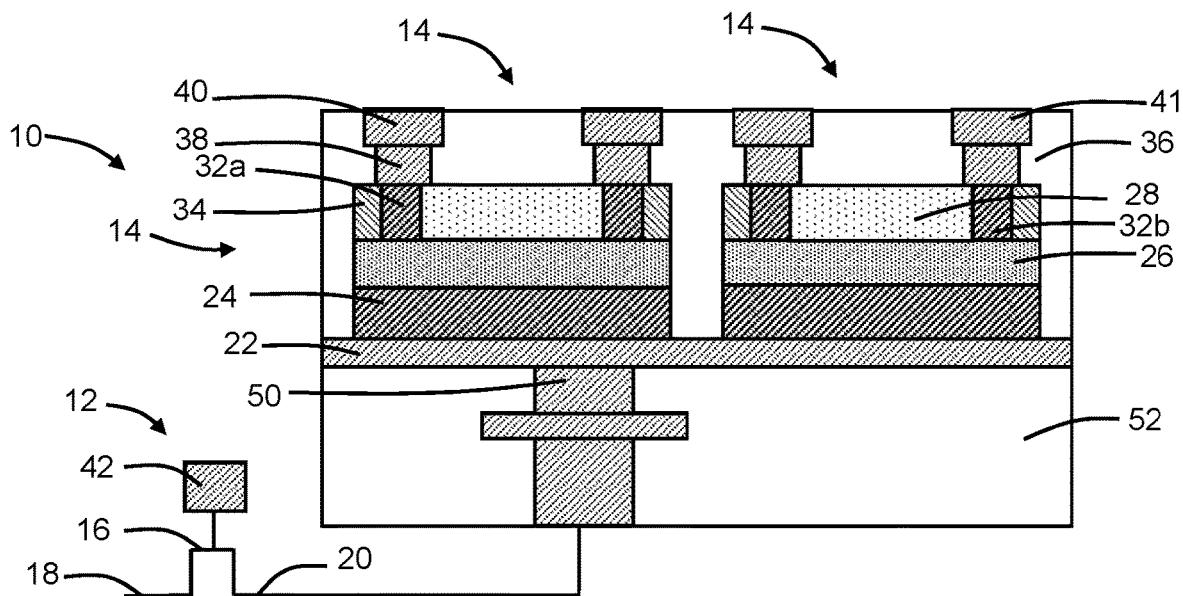
Figure 10:
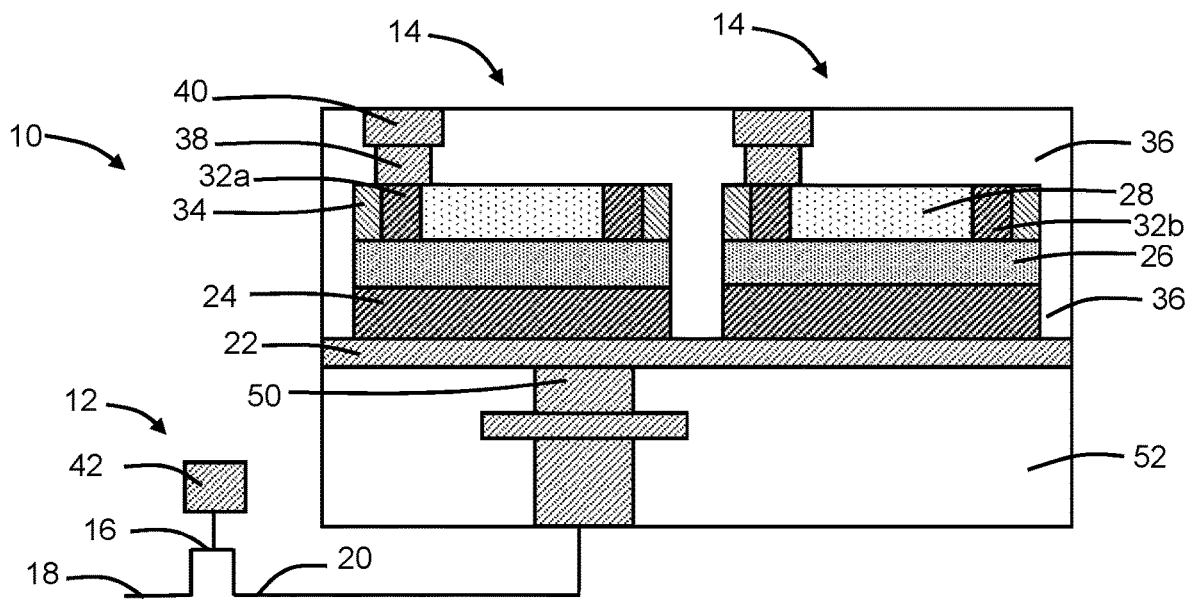

With reference to FIGS. 9 and 10 in which like reference numerals refer to like features in FIG. 8 and in accordance with alternative embodiments, the architecture of FIG. 8 may be extended to include multiple resistive memory elements 14. Each of the resistive memory elements 14 includes the top electrode 32 having multiple sections 32a, 32b. In FIG. 9, the sections 32a and 32b of the top electrode 32 of each resistive memory element 14 may be connected with different bit lines 40, 41 to provide a one transistor-n resistor (1TnR) architecture. In FIG. 10, only the top section 32a of each resistive memory element 14 may be connected only with the bit line 40 to provide a different type of 1T-nR architecture. In these alternative embodiments, the drain 20 of the transistor 12 is coupled in parallel with the different resistive memory elements 14 via the metal feature 22. In alternative embodiments, one or more additional resistive memory elements 14 may be added to the structure 10 and coupled in parallel with the drain 20 of the transistor 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first resistive memory element including a first electrode, a second electrode, and a switching layer arranged between the first electrode and the second electrode, the switching layer having a top surface with a total area, and the first electrode arranged on a first portion of the top surface of the switching layer;
   a hardmask comprised of a first dielectric material, the hardmask arranged on a second portion of the top surface of the switching layer; and
   a first transistor including a drain coupled with the second electrode,
   wherein the first portion of the top surface of the switching layer is a first fraction of the total area, the second portion of the top surface of the switching layer is a second fraction of the total area, and a sum of the first fraction of the total area and the second fraction of the total area is less than the total area.

2. The structure of claim 1 wherein the hardmask and the first electrode have approximately equal layer thicknesses.

3. The structure of claim 1 wherein the hardmask has a side surface, and the first electrode is arranged to surround the side surface of the hardmask.

4. The structure of claim 3 further comprising:
   a sidewall spacer arranged to surround the first electrode and the side surface of the hardmask, the sidewall spacer comprised of a second dielectric material different than the first dielectric material.

5. The structure of claim 4 wherein the sidewall spacer is arranged on a third portion of the top surface of the switching layer.

6. The structure of claim 1 wherein the first electrode has a rectangular annular shape that is arranged to surround the hardmask.

7. The structure of claim 1 wherein the first electrode has a closed geometrical shape with an inner side surface and an outer side surface, and the hardmask is fully arranged inside the inner side surface of the first electrode.

8. The structure of claim 1 wherein the first electrode includes a first section arranged on the top surface of the switching layer and a second section arranged on the top surface of the switching layer, and the first section of the first electrode is disconnected from the second section of the first electrode.

9. The structure of claim 8 further comprising:
   a first bit line coupled with the first section of the first electrode.

10. The structure of claim 9 further comprising:
    a second bit line coupled with the second section of the first electrode.

11. The structure of claim 8 wherein the first resistive memory element includes a third electrode arranged adjacent to the second electrode, the switching layer is arranged in a vertical direction between the first electrode and the third electrode, and further comprising:
    a second transistor including a drain coupled with the third electrode.

12. The structure of claim 1 further comprising:
    a first metallization level;
    a second metallization level; and
    an interlayer dielectric layer between the first metallization level and the second metallization level,
    wherein the switching layer, the first electrode, and the second electrode are arranged in the interlayer dielectric layer between the first metallization level and the second metallization level.

13. The structure of claim 12 further comprising:
    a second resistive memory element in the interlayer dielectric layer,
    wherein the drain of the first transistor is coupled in parallel with the first resistive memory element and the second resistive memory element.

14. The structure of claim 1 wherein the hardmask is centered on the top surface of the switching layer.

15. The structure of claim 1 further comprising:
    a sidewall spacer arranged on a third portion of the top surface of the switching layer.

16. The structure of claim 15 wherein the third portion of the top surface of the switching layer is a third fraction of the total area, and a sum of the first fraction of the total area, the second fraction of the total area, and the third fraction of the total area is substantially equal to the total area.

17. The structure of claim 7 further comprising:
    a sidewall spacer arranged on the top surface of the switching layer to surround the first electrode and the hardmask.

18. The structure of claim 17 wherein the sidewall spacer is arranged outside of the outer side surface of the first electrode.

19. The structure of claim 1 further comprising:
    a second resistive memory element,
    wherein the second electrode is shared by the first resistive memory element and the second resistive memory element.

* * * * *